United States Patent
Arvin et al.

(10) Patent No.: US 10,756,031 B1
(45) Date of Patent: Aug. 25, 2020

(54) DECOUPLING CAPACITOR STIFFENER

(71) Applicant: International Business Machines Corporation, Armonk, NY (US)

(72) Inventors: Charles L. Arvin, Poughkeepsie, NY (US); Franklin M. Baez, Fishkill, NY (US); Brian W. Quinlan, Poughkeepsie, NY (US); Charles L. Reynolds, Red Hook, NY (US); Krishna R. Tunga, Wappingers Falls, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/409,321

(22) Filed: May 10, 2019

(51) Int. Cl.
  *H01L 23/34* (2006.01)
  *H01L 23/64* (2006.01)
  *H01L 49/02* (2006.01)
  *H01L 23/04* (2006.01)
  *H01L 23/522* (2006.01)

(52) U.S. Cl.
  CPC .......... *H01L 23/642* (2013.01); *H01L 23/04* (2013.01); *H01L 23/5223* (2013.01); *H01L 28/40* (2013.01)

(58) Field of Classification Search
  USPC .......................... 257/532, 686, 687; 438/108
  See application file for complete search history.

(56) References Cited

U.S. PATENT DOCUMENTS

| | | | |
|---|---|---|---|
| 6,503,821 B2 | 1/2003 | Farquhar et al. | |
| 6,806,563 B2 | 10/2004 | Libous et al. | |
| 6,821,823 B2 | 11/2004 | Xie et al. | |
| 7,053,493 B2 | 5/2006 | Kanda et al. | |
| 7,115,988 B1 | 10/2006 | Hool | |
| 7,173,329 B2 | 2/2007 | Frutschy et al. | |
| 8,964,403 B2 | 2/2015 | Ueno | |
| 2018/0182718 A1 | 6/2018 | Karhade et al. | |
| 2019/0006333 A1* | 1/2019 | Ong | H01L 23/562 |

FOREIGN PATENT DOCUMENTS

| | | | |
|---|---|---|---|
| JP | 2000232260 A | * | 8/2000 |
| WO | 2018125251 A1 | | 7/2018 |

* cited by examiner

*Primary Examiner* — Brook Kebede
(74) *Attorney, Agent, or Firm* — ZIP Group PLLC (57) ABSTRACT

An IC device carrier includes organic substrate layers and wiring line layers therein. To reduce stain of the organic substrate layers and to provide decoupling capacitance, one or more decoupling capacitor stiffeners (DCS) are applied to the top side metallization (TSM) surface of the IC device carrier. The DCS(s) reduce the amount of curvature of the IC device carrier and reduce the strain seen by the organic substrate layers, thereby mitigating the risk for cracks forming and expanding or other damage within the carrier. The DCS(s) also include two or more capacitor plates and provides capacitance to electrically decouple electrical subsystems of the system of which the DCS is apart.

18 Claims, 10 Drawing Sheets

DECOUPLING CAPACITOR STIFFENER

FIELD OF THE EMBODIMENTS

Embodiments of the present invention generally relate to integrated circuit (IC) device carriers, and more particularly to an IC device carrier that includes a decoupling capacitor stiffener thereupon.

DESCRIPTION OF THE RELATED ART

Some IC device (e.g. IC chips, processors, application specific integrated circuit chips, dies, or the like) carriers have been recently fabricated with dielectric materials due to better electrical properties. However, in utilizing these materials in the fabrication of the carrier, an increased risk of material cracking during thermal cycling has been shown. The risk of cracking increases in multi IC chip carriers due to increased material strain caused by the relatively high curvature of the carrier in the region between the IC chips.

SUMMARY

In an embodiment of the present invention, an integrated circuit (IC) device carrier package is presented. The package includes an IC device carrier that includes a first contact upon a top side metallization (TSM) surface that is configured to provide ground potential and a second contact upon the TSM surface that is configured to provide non-ground potential. The package further includes a decoupling capacitor stiffener (DCS). The DCS includes a capacitor structure between a first conductive side bar and a second conductive size bar. The capacitor structure includes a first capacitor plate directly connected to the first conductive side bar, a second capacitor plate directly connected to the second conductive side bar; and insulative material between the first conductive side bar and the second conductive side bar and between the first capacitor plate and the second capacitor plate. The first conductive side bar includes a first contact pad and the second conductive side bar includes a second contact pad. The package further includes a first interconnect that connects the first contact that is configured to provide ground potential with the first contact pad of the first conductive side bar. The package further includes a second interconnect that connects the second contact that is configured to provide non-ground potential with the second contact pad of the second conductive side bar.

In another embodiment of the present invention, an integrated circuit (IC) device carrier package is presented. The package includes an IC device carrier that includes a first contact upon a top side metallization (TSM) surface that is configured to provide ground potential and a second contact upon the TSM surface that is configured to provide non-ground potential. The package further includes a decoupling capacitor stiffener (DCS). The DCS includes a capacitor structure and a top-side stiffener upon an upper surface of the capacitor structure. The capacitor structure includes a first capacitor plate connected to a first contact pad upon a lower surface of the capacitor structure by a first vertical interconnect access (VIA), a second capacitor plate connected to a second contact pad upon the lower surface of the capacitor structure by a second VIA, and insulative material between the first capacitor plate and the second capacitor plate. The package further includes a first interconnect that connects the first contact that is configured to provide ground potential with the first contact pad. The package further includes a second interconnect that connects the second contact that is configured to provide non-ground potential with the second contact pad.

In another embodiment, an integrated circuit (IC) device carrier package is presented. The IC device carrier includes a first contact upon a top side metallization (TSM) surface that is configured to provide ground potential and a second contact upon the TSM surface that is configured to provide non-ground potential. The package further includes a decoupling capacitor stiffener (DCS). The DCS includes a capacitor structure, a first side stiffener upon a first side surface of the capacitor structure, and a second side stiffener upon a second side surface of the capacitor structure. The capacitor structure includes a first capacitor plate connected to a first contact pad upon a lower surface of the capacitor structure by a first vertical interconnect access (VIA), a second capacitor plate connected to a second contact pad upon the lower surface of the capacitor structure by a second VIA, and insulative material between the first capacitor plate and the second capacitor plate. The package further includes a first interconnect that connects the first contact that is configured to provide ground potential with the first contact pad. The package further includes a second interconnect that connects the second contact that is configured to provide non-ground potential with the second contact pad.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

An IC device carrier includes organic substrate layers and wiring line layers therein. To reduce stain of the organic substrate layers and to provide decoupling capacitance, one or more decoupling capacitor stiffeners (DCS) are applied to the top side metallization (TSM) surface of the IC device carrier. The DCS(s) reduce the amount of curvature of the IC device carrier and reduce the strain seen by the organic substrate layers, thereby mitigating the risk for cracks forming and expanding or other damage within the carrier. The DCS(s) also include two or more capacitor plates and provides capacitance to electrically decouple electrical subsystems of the system of which the DCS is apart.

Figure 1:
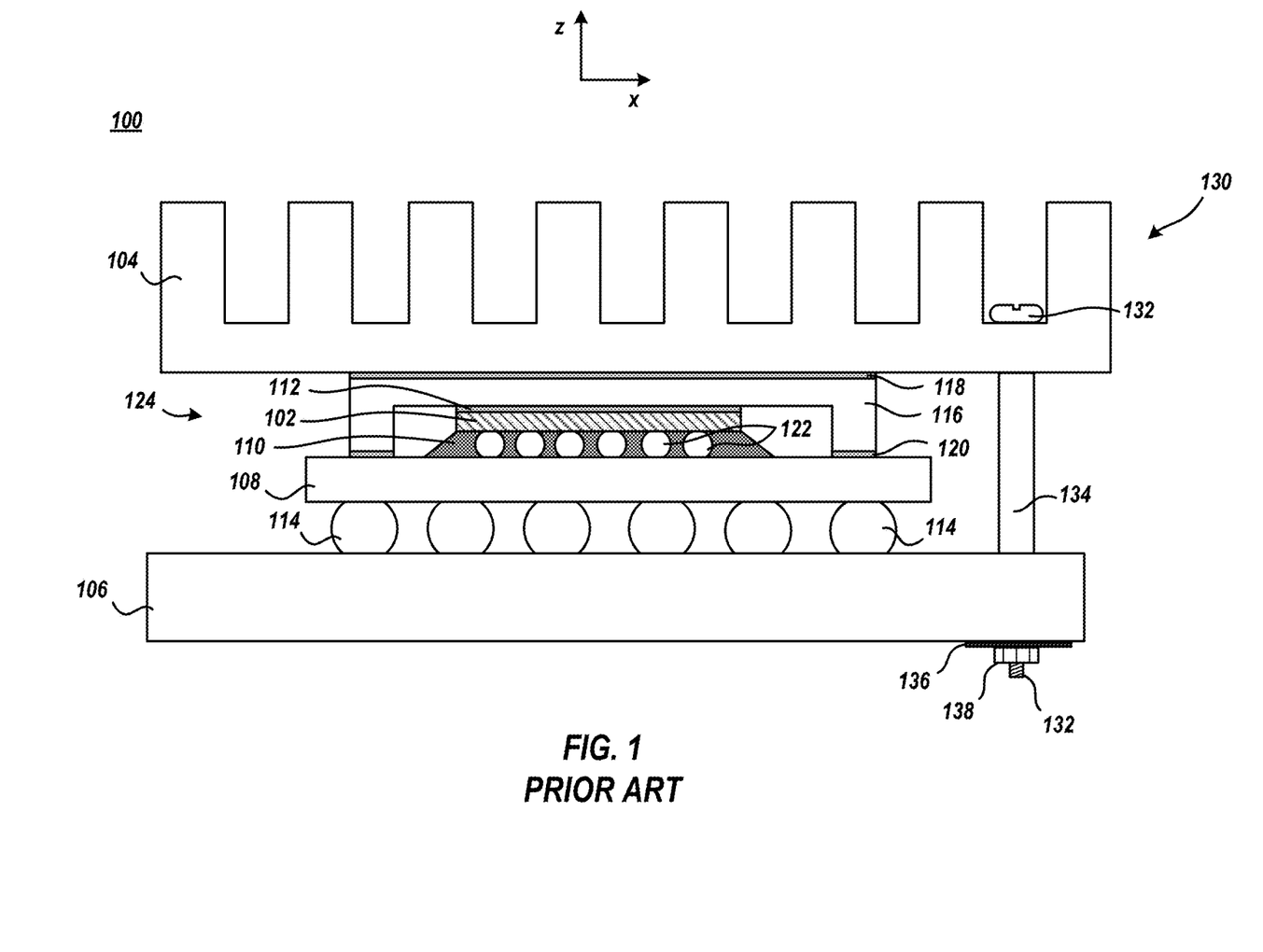
FIG. 1 depicts a prior art electronic system.

FIG. 1 depicts a prior art electronic system 100. Electronic system 100 may be for example a computer, server, etc. System 100 includes an IC chip module or package 124 that includes a chip 102, carrier 108, interconnects 122, underfill 110, thermal interface material 112, lid 116, and adhesive 120.

Chip 102 may be an IC chip, semiconductor die, processor, microchip, field programmable gate array, or the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108 a lid 116 is attached to carrier 108 with adhesive 120 to cover chip 102. Generally, during operation of electronic device 100, heat needs to be removed from chip 102. In this situation, lid 116 is both a cover and a conduit for heat transfer. As such, a thermal interface material 112 may thermally join lid 116 and chip 102.

Package 124 may be connected to a motherboard 106 via interconnects 114. Motherboard 106 may be the main printed circuit board of electronic device 100 and includes electronic components, such as a graphics processing unit, memory, and the like, and provides connectors for other peripherals. Interconnects 114 electrically connect the lower side of carrier 108 to motherboard 106 and may be a wire bond, solder bond, stud, conductive ball, conductive button, land grid array (LGA) of complaint pins, and the like.

Interconnects 114 may be larger and thus more robust than interconnects 122. When package 124 is seated upon motherboard 106 a second reflow process may be performed to join interconnects 114 to electrical contacts of both carrier 108 and motherboard 106. Alternately, a mechanical pressurized interconnect via an intervening socket may be established.

To assist in the removal of heat from chip 102 a heat sink 104 may be thermally joined to package 124 via thermal interface material 118. Heat sink 104 is a passive heat exchanger that cools chip 102 by dissipating heat into the surrounding air. As such, during operation of electronic device 100, a thermal path may exist from chip 102 to heat sink 104 through thermal interface material 112, lid 116, and thermal interface material 118, and the like. Heat sink 104 may be connected to motherboard 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon package 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon package 124.

Figure 2:
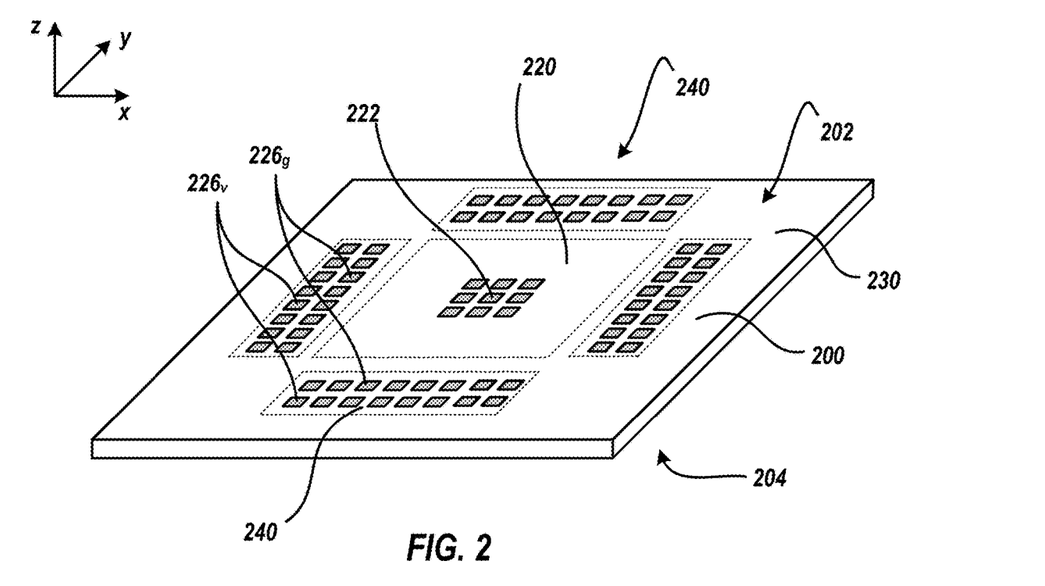
FIG. 2 depicts an isometric view of an IC device carrier, according to one or more embodiments of the present invention.
Figure 3:
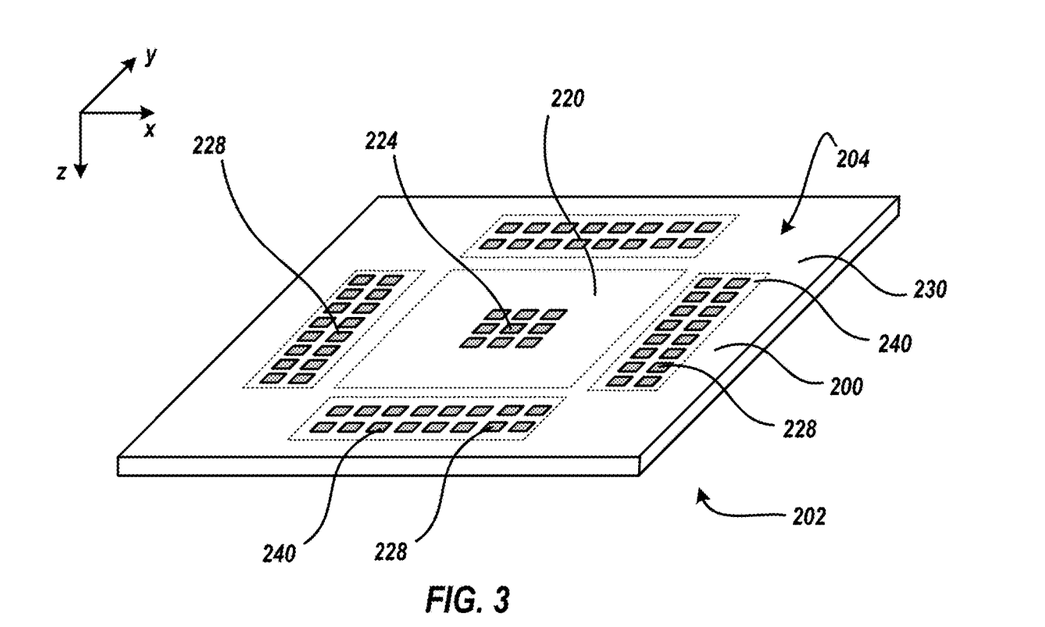
FIG. 3 depicts an isometric view of an IC device carrier, according to one or more embodiments of the present invention.

FIG. 2 and FIG. 3 depict isometric views of an IC device carrier 200 configured as a single IC device carrier. FIG. 2 depicts a top side metallization (TSM) surface 202 of the carrier 200 and FIG. 3 depicts an opposing bottom side metallization (BSM) surface 204 of the carrier 200.

Carrier 200 is an organic carrier and may be fabricated by known fabrication techniques, such as forming organic dielectric substrate layers upon a core, forming metal wiring lines upon dielectric substrate layers, or the like. According to various embodiments of the present invention, the dielectric substrate layers may be resin based layers, resin impregnated layers, or the like which are subsequently referred to herein as resin layers.

Carrier 200 may provide mechanical support for a single IC device (e.g., IC chip, processor, application specific integrated circuit chip, field programmable gate array, die, or the like). As such, carrier 200 includes a single IC device region 220. Region 220 is a projection or footprint of the perimeter of the associated IC device upon the TSM surface 202 though the IC device carrier 200. A perimeter region 230 may exist around the circumference or perimeter of the IC device region 220 through the IC device carrier 200. Carrier 200 also provides mechanical support for one or more decoupling capacitor stiffener(s), which may also be referred to as DCS(s). As such, carrier 200 includes one or more DSC regions 240. Each region 240 may be a projection or footprint of the perimeter of the associated DSC upon the TSM surface 202 of the IC device carrier 200 through the IC device carrier 200.

Electrically conductive contacts 222 may exist within IC device region 220 upon the TSM surface 202. The contacts 222 may be positioned upon the TSM surface 202 in the IC device region 220 in an array, such as columns and rows, as depicted. Similarly, electrically conductive contacts 224 may exist within IC device region 220 upon the BSM surface 204. The contacts 224 may also be positioned upon the BSM surface 204 in the IC device region 220 in an array.

The contacts 224 may have a larger contact pad surface area relative to the contact pad surface area of contacts 222. One or more conductive wiring lines fabricated within the carrier 200 may be connected to a contact 222 and to a contact 224 within the IC device region 220, as is known in the art. Such features provide electrical paths from the TSM surface 202 of carrier 200 to the opposing BSM surface 204 of carrier 200. Contacts 222 are configured to be in electrical communication with an associated IC device (e.g. IC chip, etc.) contact and contacts 224 are configured to be in electrical communication with a higher level data handling system contact, such as a system board contact, motherboard contact, or the like. Contact(s) 224 on the BSM surface 204 that are in electrical communication with associated contact(s) 222 may be in a relatively different x-y location as those contact (s) 222 upon their respective surfaces 202, 204. Generally, contacts 222 and contacts 224 are associated with the IC device.

Electrically conductive contacts 226 may exist within each DSC region 240 upon the TSM surface 202. The contacts 226 may be positioned upon the TSM surface 202 within each DSC region 240 in an array, such as columns and rows, as depicted. Similarly, electrically conductive contacts 228 may exist within each DSC region 240 upon the BSM surface 204. The contacts 228 may also be positioned upon the BSM surface 204 within each DSC region 240 in an array. The contacts 228 may have a larger contact pad surface area relative to the contact pad surface area of contacts 226. One or more conductive wiring lines fabricated within the carrier 200 may be connected to a contact 226 and to a contact 228 within each DSC region 240, as is known in the art. Such features provide electrical paths from the TSM surface 202 of carrier 200 to the opposing BSM surface 204 of carrier 200. Contacts 226 are configured to be in electrical communication with an associated DCS contact and contacts 228 are configured to be in electrical communication with a higher level data handling system contact, such as a system board contact, motherboard contact, or the like. Contact(s) 228 on the BSM surface 204 that are in electrical communication with associated contact(s) 226 may be in a relatively different x-y location as those contact (s) 226 upon their respective surfaces 202, 204. Generally, contacts 226 and contacts 228 are associated with a particular DCS.

At least one contact 226 within each DCS region 240 is configured to provide ground potential to the associated DSC and may be referred to herein as contact $226_g$. Similarly, at least one contact 226 within each DCS region 240 is configured to provide non-ground potential, power potential, or the like, to the DSC and may be referred to herein as contact $226_v$.

Multiple contacts 226 may be positioned upon the TSM surface 202 in the DSC regions 240 in an array, such as columns and rows, as depicted. One column/row in each DSC region 240 may be configured as contacts $226_g$ and the opposite column/row in each DSC region 240 may be configured as contacts $226_v$. In another implementation, a single contact $226_g$ and a single contact $226_v$ may be positioned upon the TSM surface 202 in each DSC region 240 as parallel contacts 226 across the major dimension of the associated DSC region 240. In some embodiments, one contact $226_g$ and one contact $226_v$ with each DSC region 240 may be configured to provide ground or potential, while other contacts 226 are electrically inactive (i.e. current does not flow across) and are configured for solely mechanical purposes to attach the carrier 200 to the DSC. The contacts 226 may have the same contact pad surface area relative to the contact pad surface area of contacts 222.

Likewise, multiple contacts 228 may be positioned upon the BSM surface 204 in the DSC regions 240 in an array, such as columns and rows, as depicted. One column/row in each DSC region 240 may be configured as contacts $228_g$ and the opposite column/row in each DSC region 240 may be configured as contacts $228_v$. In another implementation, a single contact $228_g$ and a single contact $228_v$ may be positioned upon the BSM surface 204 in each DSC region 240 as parallel contacts 228 across the major dimension of the associated DSC region 240. In some embodiments, one contact $228_g$ and one contact $228_v$ with each DSC region 240 may be configured to accept ground or potential, while other contacts 228 are electrically inactive (i.e. current does not flow across) and are configured for solely mechanical purposes to attach the carrier 200 to the higher level data handing system.

The contacts 226 may have the same contact pad surface area relative to the contact pad surface area of contacts 222. The contacts 228 may have the same contact pad surface area relative to the contact pad surface area of contacts 224.

A contact $226_g$ within each DCS region 240 is configured to be in electrical communication with a ground capacitor plate within the associated DCS. Similarly, a contact $228_g$ within each DCS region 240 may be configured to be in electrical communication with the ground capacitor plate within the associated DCS. These contacts $226_g$ and contacts $228_g$ may be electrically connected by a wiring line within the carrier 200. Likewise, a contact $226_v$ within each DCS region 240 is configured to be in electrical communication with a non-ground capacitor plate within the associated DCS. Similarly, a contact $228_v$ within each DCS region 240 may be configured to be in electrical communication with the non-ground capacitor plate within the associated DCS. These contacts $226_v$ and contacts $228_v$ may be electrically connected by a wiring line within the carrier 200.

Ground potential and non-ground potential may be provided to respective contact(s) $228_g$, $228_v$ within each region 240 directly from the higher level data handling system and passed to associated contacts $226_g$ and $226_v$. Alternatively, ground potential and non-ground potential may be provided to respective contact(s) $226_g$, $226_v$ within each region 240 indirectly from the higher level data handling system by way of the IC device. In this implementation, contact $226_g$ may be electrically connected to a contact 222 that provides the ground potential by a wiring line within carrier 200 and contact $226_v$ may be electrically connected to a contact 222 that provides the non-ground potential by a wiring line within carrier 200.

Each DCS region 240 may be positioned within the perimeter region 230 parallel with a different side surface of the IC device, respectively. The DCS region 240 may be positioned close to the IC device region 220. For example, each DCS region 240 may be positioned to be less than one millimeter from a different side surface of the IC device, respectively.

Figure 4:
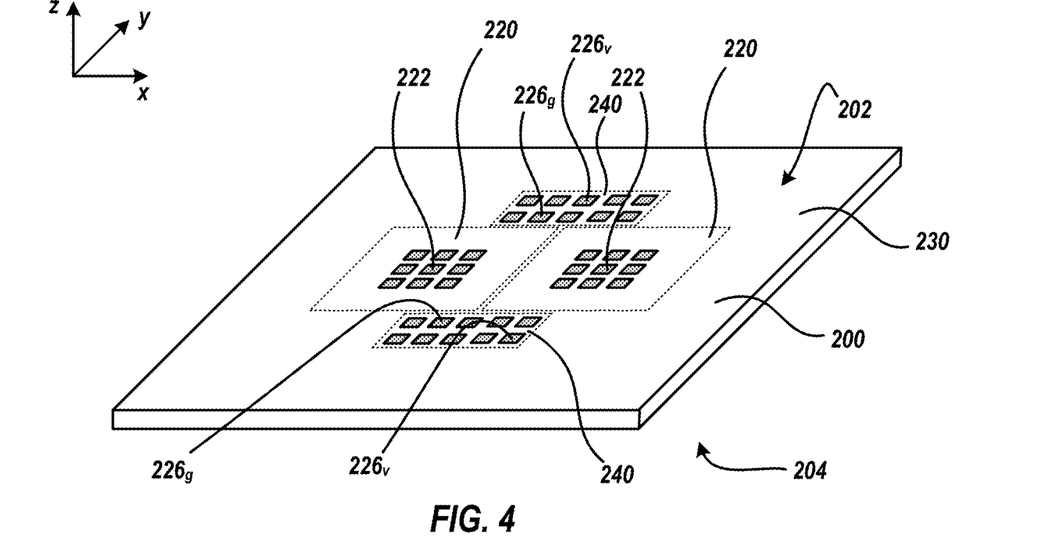
FIG. 4 depicts an isometric view of an IC device carrier, according to one or more embodiments of the present invention.
Figure 5:
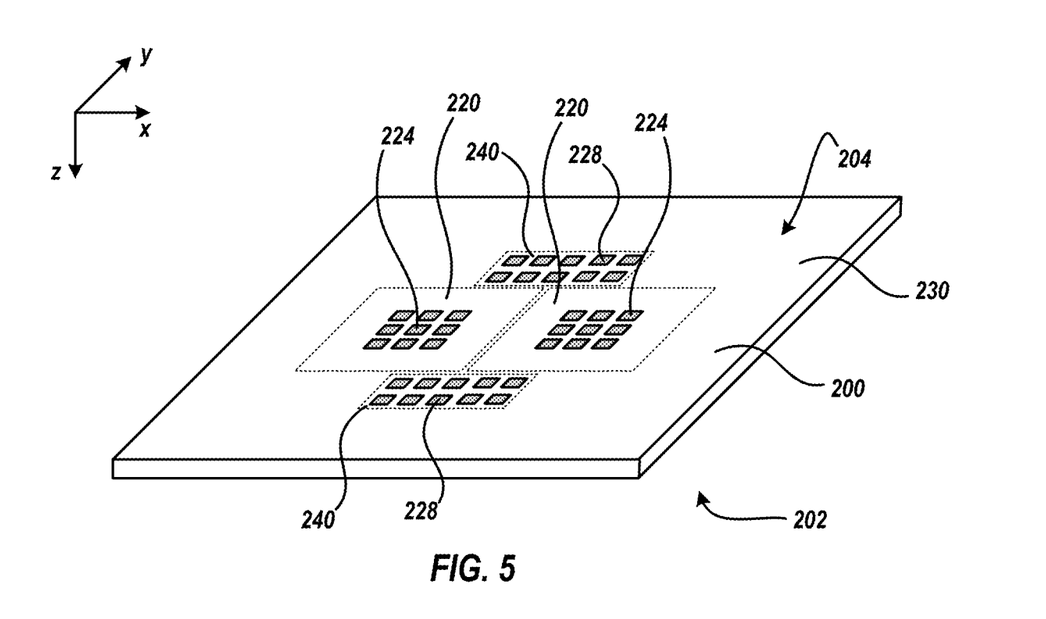
FIG. 5 depicts an isometric view of an IC device carrier, according to one or more embodiments of the present invention.

FIG. 4 and FIG. 5 depict isometric views of an IC device carrier 200 configured as a multiple IC device carrier. FIG. 4 depicts TSM surface 202 of the carrier 200 and FIG. 5 depicts BSM surface 204 of the carrier 200.

Carrier 200 may provide mechanical support for multiple IC devices. The IC devices may be the same type or different types of IC devices. As such, carrier 200 includes multiple IC device regions 220. Each region 220 is a projection or footprint of the perimeter of the associated IC device upon the TSM surface 202 though the IC device carrier 200. A perimeter region 230 may exist around the circumference or perimeter of the multiple IC device regions 220 through the IC device carrier 200. Carrier 200 also provides mechanical support for one or more DCS(s). As such, carrier 200 includes one or more DSC regions 240. Each region 240 may be a projection or footprint of the perimeter of the associated DSC upon the TSM surface 202 of the IC device carrier 200 through the IC device carrier 200. The features and descriptions of components discussed with reference to the single region 220 above may be repeated for each instance of region 220 in the present embodiment.

Ground potential and non-ground potential may be provided to respective contact(s) $228_g$, $228_v$ within each region 240 directly from the higher level data handling system and passed to associated contacts $226_g$ and $226_v$. Alternatively, ground potential and non-ground potential may be provided to respective contact(s) $226_g$, $226_v$ within each region 240 indirectly from the higher level data handling system by way of the IC device in an associated region 220. In this implementation, contact $226_g$ may be electrically connected to a contact 222 that provides the ground potential by a wiring line within carrier 200 and contact $226_v$ may be electrically connected to a contact 222 that provides the non-ground potential by a wiring line within carrier 200. For example, a first IC device within a first region 220 may provide ground potential and non-ground potential to a first DCS and a second IC device within a second region 220 may provide ground potential and non-ground potential to a second DCS.

Each DCS region 240 may be positioned within the perimeter region 230 parallel with respective coplanar side surfaces of multiple IC devices, respectively. For example, a first DCS region 240 may be positioned parallel to coplanar side surfaces of a first IC device and a second IC device respectively. The DCS region(s) may be further positioned such that the interface (yz plane) between the first IC device and the second IC device intersects the DCS region(s), as is depicted. Each DCS region 240 may be positioned close to one or more IC device regions 220. For example, each DCS region 240 may be positioned to be less than one millimeter from one or more respective side surfaces of the IC devices, respectively.

Figure 6:
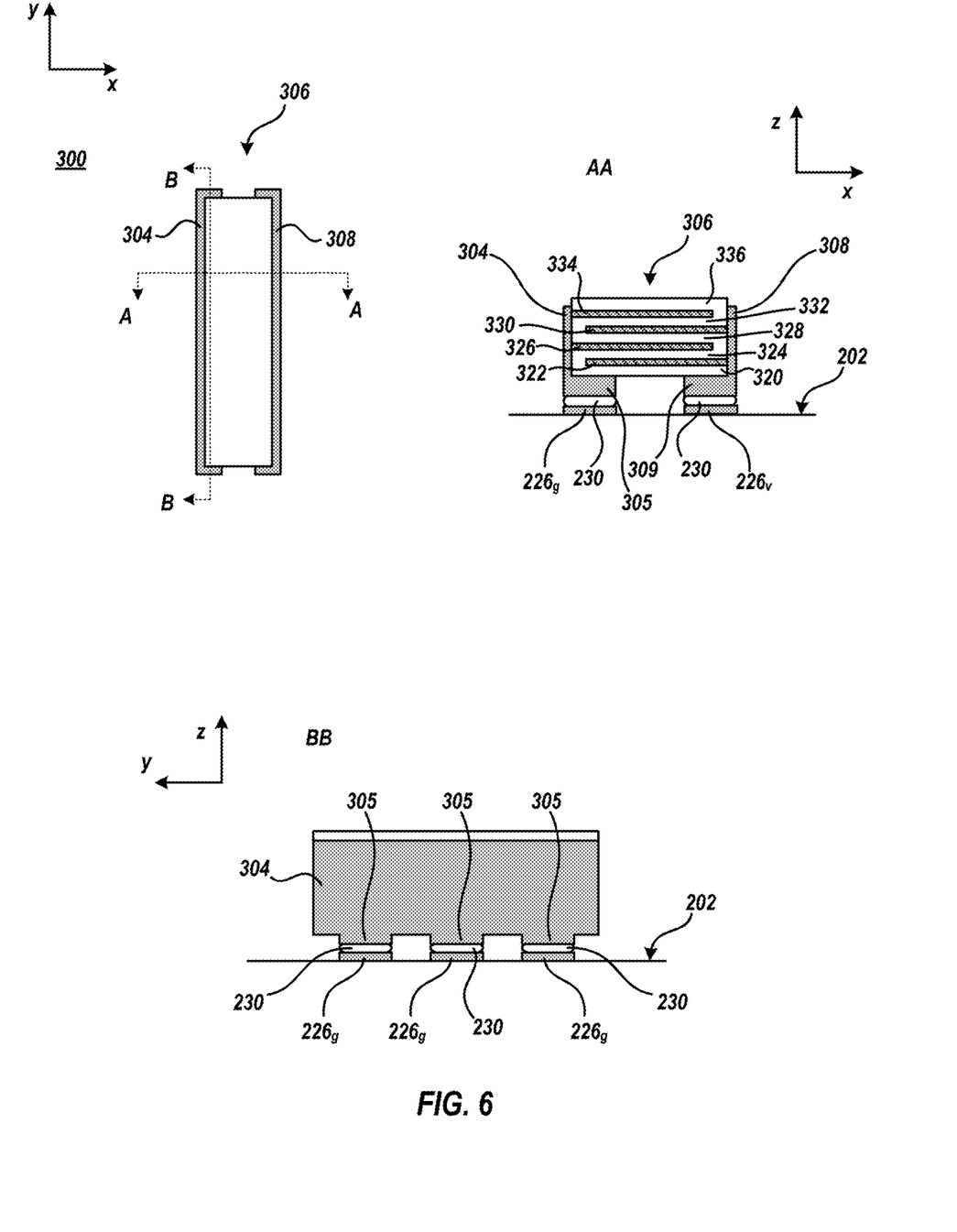
FIG. 6 depicts various views of an exemplary decoupling capacitor stiffener, according to one or more embodiments of the present invention.

FIG. 6 depicts various views of an exemplary DCS 300, according to one or more embodiments of the present invention. DCS 300 includes an electrically conductive side bar 304, an electrically conductive side bar 308, and a capacitor structure 306 between the conductive side bar 304 and conductive side bar 308. The capacitor structure 306 includes at least a first conductive capacitor plate separated from a second capacitor plate by one or more dielectric or insulator layers.

In an implementation, as depicted, the capacitor structure 306 includes a dielectric layer 320 and a capacitor plate 322 formed directly thereupon. The capacitor plate 322 may be inset from the z-axis plane left side surface of layer 320 and may be coplanar with the z-axis plane right side surface of layer 320. A dielectric layer 320 may be formed upon plate 322. The z-axis plane right side and left side surfaces of layer 324 may be coplanar with the same respective side surfaces of layer 322. A capacitor plate 326 may be formed directly upon layer 324. The capacitor plate 326 may be inset from the z-axis plane right side surface of layer 324 and may be coplanar with the z-axis plane left side surface of layer 324.

A dielectric layer 328 may be formed upon plate 326. The z-axis plane right side and left side surfaces of layer 328 may be coplanar with the same respective side surfaces of layer 324. A capacitor plate 330 may be formed directly upon layer 328. The capacitor plate 330 may be inset from the z-axis plane left side surface of layer 328 and may be coplanar with the z-axis plane right side surface of layer 328.

A dielectric layer 332 may be formed upon plate 328. The z-axis plane right side and left side surfaces of layer 332 may be coplanar with the same respective side surfaces of layer 328. A capacitor plate 334 may be formed directly upon layer 332. The capacitor plate 334 may be inset from the z-axis plane right side surface of layer 332 and may be coplanar with the z-axis plane left side surface of layer 332. A dielectric layer 336 may be formed upon plate 328334 The z-axis plane right side and left side surfaces of layer 336 may be coplanar with the same respective side surfaces of layer 332.

The z-axis plane right side and left side surfaces of capacitor structure 306 may be planarized to expose the respective capacitor plates 322, 326, 330, and 334. Subsequently, conductive side bar 304 and electrically conductive side bar 308 may be formed directly upon at least the z-axis plane right side and left side surfaces of capacitor structure 306. Conductive side bar 304 is therefore formed to at least contact the capacitor plate(s) exposed to the z-axis plane left side surfaces of capacitor structure 306. Likewise, conductive side bar 308 is formed to at least contact the capacitor plate(s) exposed to the z-axis plane right side surfaces of capacitor structure 306.

Conductive side bar 304 and conductive side bar 308 may each include one or more contact pads 305 formed therein. The contact pads 305 may be the same relative pitch and size relative to contacts 226 of carrier 200.

Contact pad(s) 305 of side bar 304 may be connected to contact(s) $226_g$ of carrier 200 by a conductive interconnect 230. For example, a contact pad 305 of side bar 304 may be connected to a contact $226_g$ of carrier 200 by solder, or the like. Contact pad(s) 305 of side bar 308 may be connected to contact(s) $226_v$ of carrier 200 by a conductive interconnect 230. For example, a contact pad 305 of side bar 308 may be connected to a contact $226_v$ of carrier 200 by solder, or the like. As such, upon when potential is passed from carrier 200 into DCS 300, side bar 304 as well as those capacitor plates within structure 306 that are connected thereto is at the potential of $226_g$. Similarly, upon when potential is passed from carrier 200 into DCS 300, side bar 308 as well as those capacitor plates within structure 306 that are connected thereto is at the potential of $226_v$.

In this manner, capacitive elements are provided within DCS 300 which may be utilized to decouple a first electrical subsystem or circuit from a second electrical subsystem or circuit of a system in which DCS 300 is apart. In other words, DCS 300 shunts noise generated by the first electrical subsystem, reducing the effect the noise has on the rest of the system in which DCS is apart.

DCS 300 is applied, formed, bonded, connected, or otherwise attached to the TSM surface 202 within DCS region 240. DCS 300 is formed of a material or materials with sufficient rigidity or stiffness to locally resist curvature of carrier 200. DCS 300 may be formed of a material or materials that has the same or substantially similar (i.e. plus or minus an acceptable fabrication or system tolerance known in the art) coefficient of thermal expansion (CTE) relative to the carrier 200. In some embodiments, the side bar 304 and side bar 308 may be a metal bar, or the like. For example, side bar 304 and side bar 308 may be a steel, copper, tungsten, aluminum, or the like (or appropriate alloy(s) thereof) bar.

DCS 300 is connected to the carrier by at least a first interconnect 230 that connects contact 305 with contact $226_g$ and a second interconnect 230 that connects contact 305 with contact $226_v$. DCS 300 may further be connected to the carrier by adhesive (not shown). For example, adhesive may connect the undersurface of layer 320 with the TSM surface 202 of carrier 200.

DCS 300 adds rigidity or stiffness to carrier 200 to effectively resist local strain forces that would otherwise be exerted upon the layer(s) material buildup of the the carrier 200. As such, DCS 300 mitigates the risks of cracking and/or crack propagation within the substrate layer(s) of carrier 200.

Figure 7:
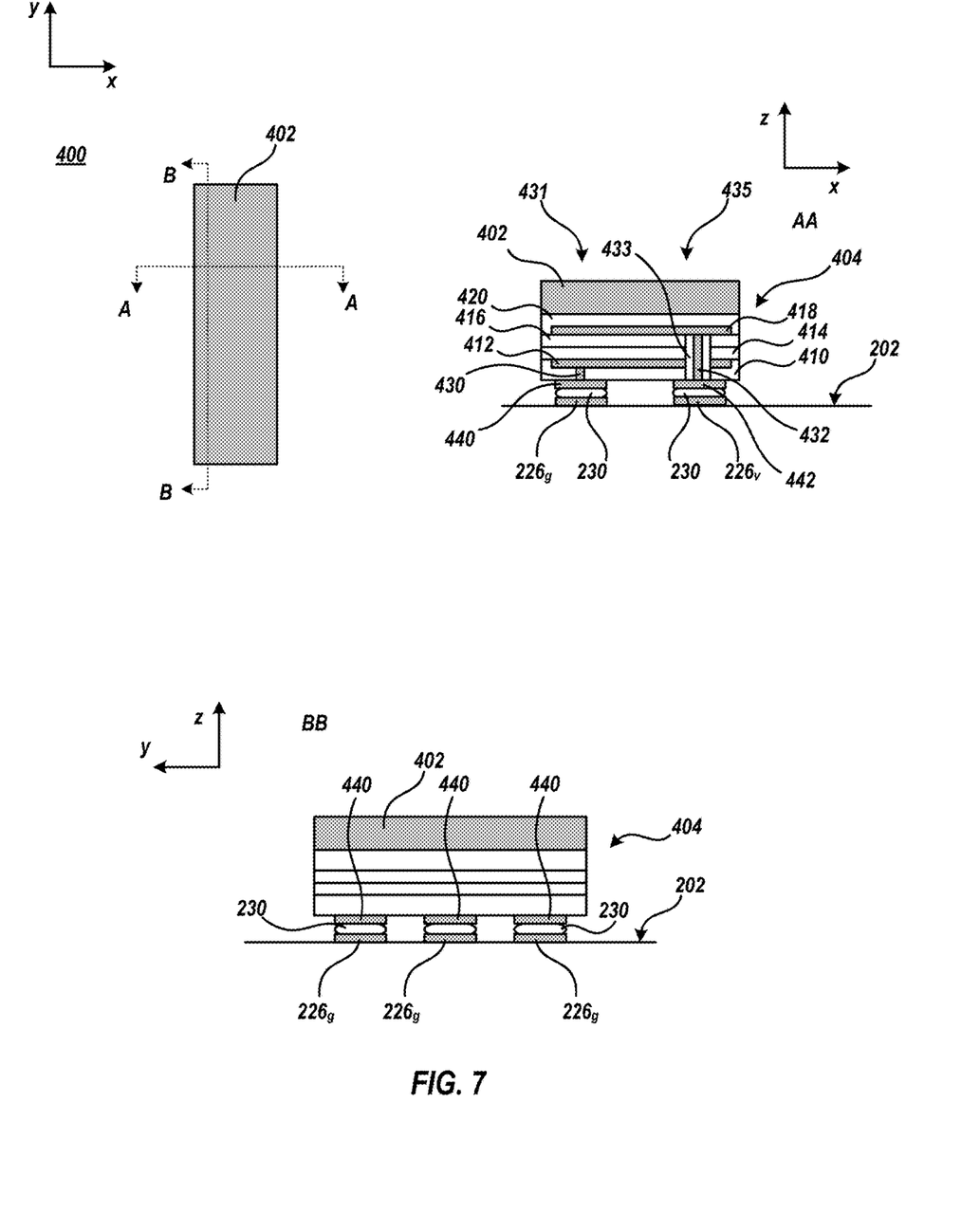
FIG. 7 depicts various views of an exemplary decoupling capacitor stiffener, according to one or more embodiments of the present invention.

FIG. 7 depicts various views of an exemplary DCS 400, according to one or more embodiments of the present invention. DCS 400 includes a top-side stiffener 402 and a capacitor structure 404 below the top-side stiffener 402. The capacitor structure 404 includes at least a first conductive capacitor plate separated from a second capacitor plate by one or more dielectric or insulator layer(s).

In an implementation, as depicted, the capacitor structure 404 includes a dielectric layer 410 and a capacitor plate 412 formed directly thereupon. The capacitor plate 412 may be inset from the z-axis plane left side surface and z-axis plane right side surface of layer 410. A vertical interconnect access (VIA) trench 431 may be formed in layer 410 and a VIA 430 may be formed within the VIA trench. VIA 430 is formed of a conductive material and is connected to capacitor plate 412. A VIA trench 435 portion may be formed in layer 410 and in plate 412.

A dielectric layer 414 may be formed upon plate 412. The z-axis plane right side and left side surfaces of layer 414 may be coplanar with the same respective side surfaces of layer 410. A VIA trench 435 portion may be formed in layer 414 in line with the previous VIA trench 435 portion. A dielectric layer 416 may be formed dielectric layer 414. The z-axis plane right side and left side surfaces of layer 416 may be coplanar with the same respective side surfaces of layer 414. A VIA trench 435 portion may be formed in layer 416 in line with the previous VIA trench 435 portion to form the VIA trench 435. A dielectric or insulator material liner 433 may be formed upon the sidewalls of VIA trench 435 and a conductive VIA 432 may be formed within the liner 433 in the VIA trench 435.

A capacitor plate 418 may be formed directly upon layer 416. The capacitor plate 418 may be inset from the z-axis plane left side surface and z-axis plane right side surface of layer 416. VIA 432 is formed of a conductive material and is connected to capacitor plate 418.

A dielectric layer 420 may be formed upon plate 418. The z-axis plane right side and left side surfaces of layer 420 may be coplanar with the same respective side surfaces of layer 416. Top-side stiffener 402 may be formed directly upon the dielectric layer 420. For example, a conductive seed layer may be formed upon dielectric layer 420 and a metal layer may be plated upon the dielectric layer 420 consuming the seed layer.

Electrically conductive contact pads 440, 442 may be formed upon the carrier facing surface of layer 410. Contact pads 440, 442 may be positioned to align with respective contacts 226 of carrier 200. Therefore, the contacts 440, 442 may be positioned in an array. Each contact 440, 442 may have a similar contact pad size, shape, and/or surface area relative to its associated contact 226.

Contacts 440, 442 are configured to be in electrical communication with an associated contact 226 of carrier 200. For example, each contact 440 may be in electrical contact with contact $226_g$ by way of an interconnect 230 and each contact 442 may be in electrical contact with contact $226_v$ by way of an interconnect 230. As such, upon when potential is passed from carrier 200 into DCS 400, contact 440 as well as those capacitor plates within structure 404 that are connected thereto (e.g., capacitor plate 412, etc.) are at the potential of $226_g$. Similarly, upon when potential is passed from carrier 200 into DCS 400, contact 442 as well as those capacitor plates within structure 404 that are connected thereto (e.g., capacitor plate 418, etc.) are at the potential of $226_v$.

In this manner, capacitive elements are provided within DCS 400 which may be utilized to decouple a first electrical subsystem or circuit from a second electrical subsystem or circuit of a system in which DCS 400 is apart. In other words, DCS 400 shunts noise generated by the first electrical subsystem, reducing the effect the noise has on the rest of the system in which DCS 400 is apart.

DCS 400 is applied, formed, bonded, connected, or otherwise attached to the TSM surface 202 within DCS region 240. DCS 400 is formed of a material or materials with sufficient rigidity or stiffness to locally resist curvature of carrier 200. DCS 400 may be formed of a material or materials that has the same or substantially similar (i.e. plus or minus an acceptable fabrication or system tolerance known in the art) coefficient of thermal expansion (CTE) relative to the carrier 200. In some embodiments, the top-side stiffener 402 may be a metal bar, or the like. For example, top-side stiffener 402 may be a steel, copper, tungsten, aluminum, or the like (or appropriate alloy(s) thereof) bar.

DCS 400 is connected to the carrier by at least a first interconnect 230 that connects contact 440 with contact $226_g$ and a second interconnect 230 that connects contact 432 with contact $226_v$. DCS 400 may further be connected to the carrier by adhesive (not shown). For example, adhesive may connect the undersurface of layer 410 with the TSM surface 202 of carrier 200.

DCS 400 adds rigidity or stiffness to carrier 200 to effectively resist local strain forces that would otherwise be exerted upon the layer(s) material buildup of the carrier 200. As such, DCS 400 mitigates the risks of cracking and/or crack propagation within the substrate layer(s) of carrier 200.

Figure 8:
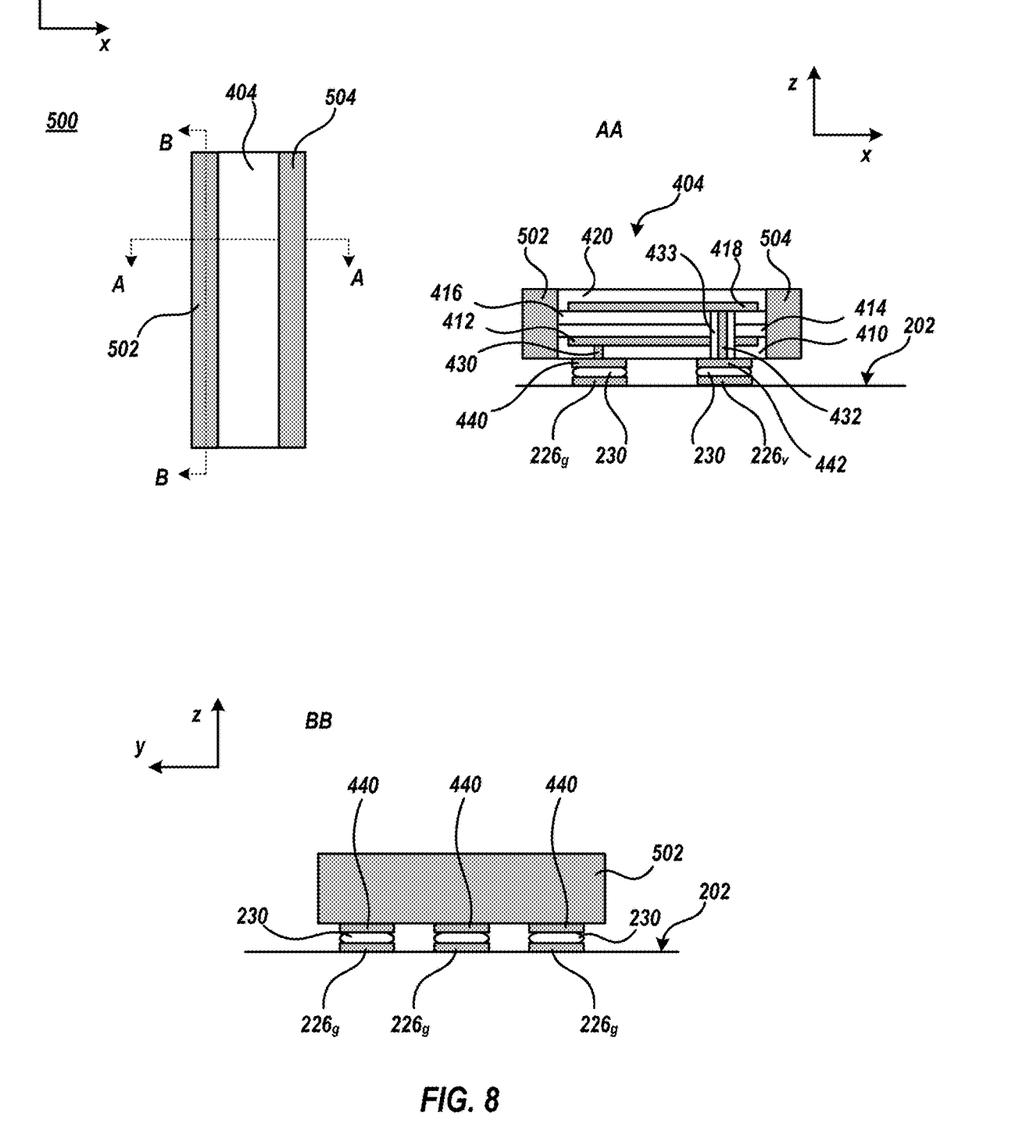
FIG. 8 depicts various views of an exemplary decoupling capacitor stiffener, according to one or more embodiments of the present invention.

FIG. 8 depicts various views of an exemplary DCS 500, according to one or more embodiments of the present invention. DCS 500 includes capacitor structure 404 between a side stiffener 502 and a side stiffener 504.

Side stiffener 502 may be formed directly upon the z-axis left side surfaces of layers 410, 414, 416, and 420. For example, a conductive seed layer may be formed upon the z-axis left side surfaces of layers 410, 414, 416, and 420 and a metal layer may be plated thereupon consuming the seed layer. Likewise, side stiffener 504 may be formed directly upon the z-axis right side surfaces of layers 410, 414, 416, and 420. For example, a conductive seed layer may be formed upon the z-axis right side surfaces of layers 410, 414, 416, and 420 and a metal layer may be plated thereupon consuming the seed layer.

Upon when potential is passed from carrier 200 into DCS 500, contact 440 as well as those capacitor plates within structure 404 that are connected thereto (e.g., capacitor plate 412, etc.) are at the potential of $226_g$. Similarly, upon when potential is passed from carrier 200 into DCS 500, contact 442 as well as those capacitor plates within structure 404 that are connected thereto (e.g., capacitor plate 418, etc.) are at the potential of $226_v$.

In this manner, capacitive elements are provided within DCS 500 which may be utilized to decouple a first electrical subsystem or circuit from a second electrical subsystem or circuit of a system in which DCS 400 is apart. In other words, DCS 500 shunts noise generated by the first electrical subsystem, reducing the effect the noise has on the rest of the system in which DCS 500 is apart.

DCS 500 is applied, formed, bonded, connected, or otherwise attached to the TSM surface 202 within DCS region 240. DCS 500 is formed of a material or materials with sufficient rigidity or stiffness to locally resist curvature of carrier 200. DCS 500 may be formed of a material or materials that has the same or substantially similar (i.e. plus or minus an acceptable fabrication or system tolerance known in the art) coefficient of thermal expansion (CTE) relative to the carrier 200. In some embodiments, the side stiffeners 502, 504 may be a metal bar, or the like. For example, side stiffeners 502, 504 may be a steel, copper, tungsten, aluminum, or the like (or appropriate alloy(s) thereof) bar.

DCS 500 is connected to the carrier by at least a first interconnect 230 that connects contact 440 with contact $226_g$ and a second interconnect 230 that connects contact 432 with contact $226_v$. DCS 500 may further be connected to the carrier by adhesive (not shown). For example, adhesive may connect the undersurface of layer 410 with the TSM surface 202 of carrier 200.

DCS 500 adds rigidity or stiffness to carrier 200 to effectively resist local strain forces that would otherwise be exerted upon the layer(s) material buildup of the carrier 200. As such, DCS 500 mitigates the risks of cracking and/or crack propagation within the substrate layer(s) of carrier 200.

Figure 9:
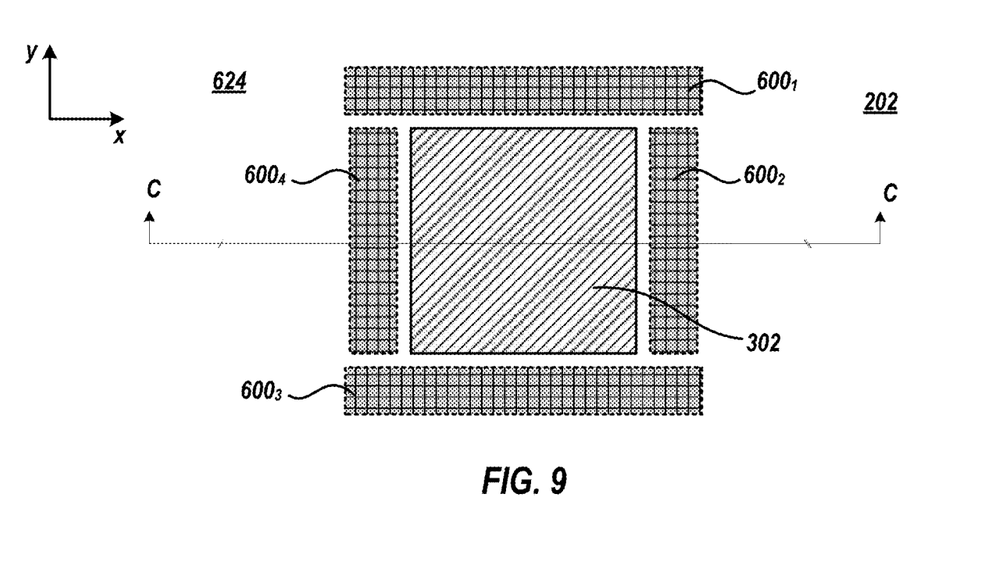
FIG. 9 depicts a normal view of an exemplary IC device carrier package, according to one or more embodiments of the present invention.

FIG. 9 depicts a normal view of an exemplary IC device carrier package 624 when carrier 200 is configured as a single IC device carrier. In the present example, IC device carrier 200 includes an IC device region 220 that includes an IC device 302 that is mounted or otherwise connected to carrier 200. Further, multiple DCS $600_1$-$600_4$ are applied, formed, bonded, connected, or otherwise attached to the TSM surface 202 within respective DSC regions 240. DCS 600 may be any one of DCS 300, 400, and/or 500.

DCS $600_1$-$600_4$ may be positioned concentrically around the IC device 302 as is depicted. As such yz and/or xz plane side surfaces of multiple DCS $600_1$-$600_4$ may be coplanar. Further, yz and/or xz plane side surfaces of one or more DCS $600_1$-$600_4$ may be coplanar with yz and/or xz plane side surfaces of the IC device 302. For example, the xz plane front and rear surfaces of $600_2$ and $600_4$ is coplanar with the xz plane front and rear surfaces of IC device 302, respectively. Similarly, the xy plane upper or top surfaces of each DCS $600_1$-$600_4$ may be coplanar with the xy plane upper or top surface of the IC device 302.

Figure 10:
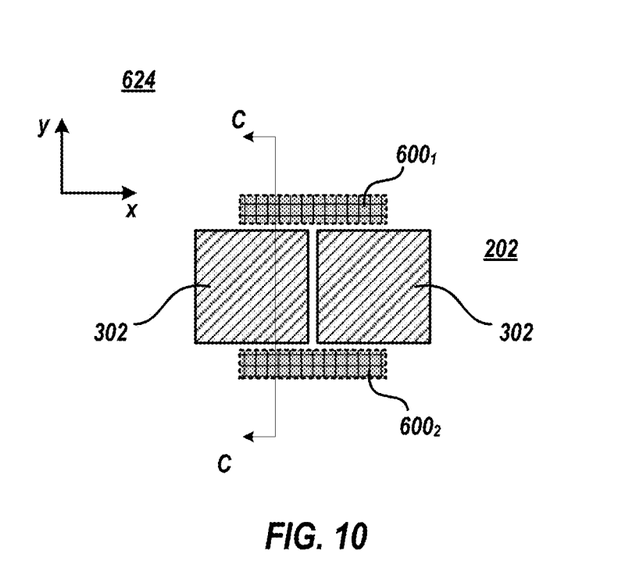
FIG. 10 depicts a normal view of an exemplary IC device carrier package, according to one or more embodiments of the present invention.

FIG. 10 depicts a normal view of an exemplary IC device carrier package 624 when carrier 200 is configured as a two IC device carrier. In the present example, IC device carrier 200 includes two IC device regions 220 with each including an IC device 302 that is mounted or otherwise connected to carrier 200. Further, multiple DCS $600_1$ and $600_2$ are applied, formed, bonded, connected, or otherwise attached to the TSM surface 202 within respective DSC regions 240.

$600_1$ and $600_2$ may be positioned concentrically around the IC device 302 such that an yz intersection plane between the IC devices intersects both $600_1$ and $600_2$. yz plane side surfaces of $600_1$ and $600_2$ may be coplanar. Further, yz plane side surfaces of $600_1$ and $600_2$ may be coplanar with yz plane side surfaces of the IC devices 302. For example, the yz plane side surfaces of $600_1$ and $600_2$ may be coplanar with opposing yz side surfaces of the IC devices 302. Alliteratively, the yz plane side surfaces of $600_1$ and $600_2$ may extend beyond the opposing yz side surfaces of the IC devices 302. Even further, the yz plane side surfaces of $600_1$ and $600_2$ may be inset from the opposing yz side surfaces of the IC devices 302, as is depicted. The xy plane upper or top surfaces of $600_1$ and $600_2$ may be coplanar with the xy plane upper or top surface of both of the IC devices 302.

Figure 11:
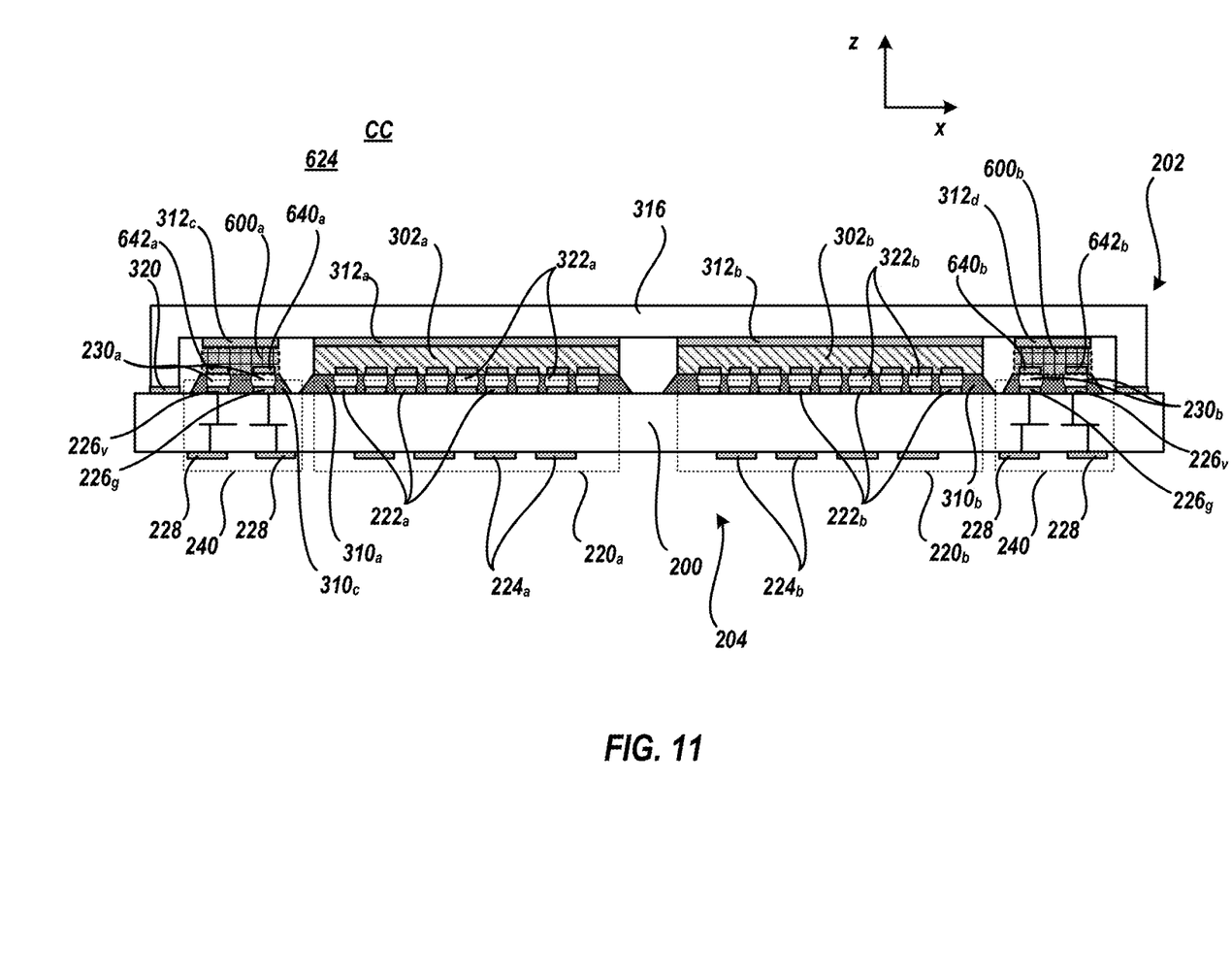
FIG. 11 depicts a cross section view of an exemplary IC device carrier package, according to one or more embodiments of the present invention.

FIG. 11 depicts a cross section view of IC device carrier 624, according to one or more embodiments of the present invention. Carrier 624, which may also be referred to as a package, module, or the like, includes multiple IC devices 302, carrier 200, interconnects 230, 322, underfill 310, thermal interface material 312, lid 316, adhesive 320, and one or more DSC 600 connected to the TSM surface 202 of carrier 200.

IC device 302 may be an IC chip, semiconductor die, processor, microchip, field programmable gate array, ASIC, co-processor, or the like.

Carrier 200 is an organic carrier and provides mechanical and electrical support for multiple IC devices 302, such as the depicted IC device $302_a$ and IC device $302_b$. As such, carrier 200 includes multiple IC device regions 220, depicted in FIG. 7 as $220_a$ and $220_b$.

Electrically conductive contacts $322_a$ exist within the IC device region $220_a$ upon the TSM surface 202. Electrically conductive contacts $222_b$ exist within the IC device region $220_b$ upon the TSM surface 202. Similarly, electrically conductive contacts $224_a$ exist within each IC device region $220_a$ and electrically conductive contacts $224_b$ exist within each IC device region $220_b$ upon the BSM surface 204. The contacts $224_a$ and $224_b$ have a larger contact pad surface area relative to the contact pad surface area of contacts $222_a$ and $222_b$. One or more conductive wiring lines fabricated within the carrier 200 may be connected to a contact 222 and to a contact 224 within the same IC device region 220, as is known in the art. Such features provide electrical paths from the TSM surface 202 of carrier 200 to the opposing BSM surface 204 of carrier 200.

Each contact $222_a$ is in electrical communication with a contact of the associated IC device $302_a$ by way of an interconnect $322_a$. Likewise, each contact $222_b$ is in electrical communication with a contact of the associated IC device $302_b$ by way of an interconnect $322_b$. Contacts $224_a$ and $224_b$ are configured to be in electrical communication with a higher level data handling system contact, such as a system board contact, motherboard contact, or the like.

Interconnects $322_a$ electrically connect IC device $302_a$ and the TSM surface 202 of carrier 200 and may be a wire bond, solder bond, stud, conductive ball, conductive button, and the like. Interconnects $322_b$ electrically connect IC device $302_b$ and the TSM surface 202 of carrier 200 and may be a wire bond, solder bond, stud, conductive ball, conductive button, and the like.

Underfill $310_a$ may be electrically-insulating, may substantially surround interconnects $322_a$, may isolate individual interconnects $322_a$, and may provide mechanical support between IC device $302_a$ and carrier 200. Underfill $310_a$ may also prevent damage to individual interconnects $322_a$ due to potential CTE mismatches between IC device $302_a$ and carrier 200. Underfill $310_b$ may be electrically-insulating, may substantially surround interconnects $322_b$, may isolate individual interconnects $322_b$, and may provide mechanical support between IC device $302_b$ and carrier 200.

Underfill $310_b$ may also prevent damage to individual interconnects $322_b$ due to potential CTE mismatches between IC device $302_b$ and carrier 200.

When IC device $302_a$ and IC device $302_b$ are seated upon carrier 200, a reflow process may be performed to join interconnects 322 to the associated electrical contacts IC device $302_a$ or IC device $302_b$ and contacts $222_a$ or $222_b$ of carrier 200, respectively.

One or more DSCs are applied, formed, bonded, connected, or otherwise attached to the TSM surface 202 within region 240 of carrier 200, respectively. Electrically conductive contacts $226_v$ and $226_g$ exist within each region 240 upon the TSM surface 202. Similarly, electrically conductive contacts 228 exist within each region 240 upon the BSM surface 204. The contacts 228 may have a larger contact pad surface area relative to the contact pad surface area of contacts 226. One or more conductive wiring lines within the carrier 200 may be connected to a contact 226 and to a contact 228 within the same region 240, as depicted. Such features provide electrical paths from the TSM surface 202 of carrier 200 to the opposing BSM surface 204 of carrier 200.

Each contact 226 is in electrical communication with a contact $640_a$, $642_a$ of the associated DCS $640_a$ by way of an interconnect $230_a$. Likewise, each contact 226 is in electrical communication with a contact $640_b$, $642_b$ of the associated DCS $640_b$ by way of an interconnect $230_b$. Interconnect 230 electrically connect the DCS 600 and the TSM surface 202 of carrier 200 and may be a wire bond, solder bond, stud, conductive ball, conductive button, and the like.

Underfill $310_c$ may be electrically-insulating, may substantially surround interconnects $230_a$, may isolate individual interconnects $230_a$, and may provide mechanical support between DCS $600_a$ and carrier 200. Underfill $310_c$ may also prevent damage to individual interconnects $230_a$ due to potential CTE mismatches between DCS $600_a$ and carrier 200. Underfill $310_d$ may be electrically-insulating, may substantially surround interconnects $230_b$, may isolate individual interconnects $230_b$, and may provide mechanical support between DCS $600_b$ and carrier 200. Underfill $310_d$ may also prevent damage to individual interconnects $230_b$ due to potential CTE mismatches between DCS $600_b$ and carrier 200.

When DCS $600_a$ and DCS $600_b$ are seated upon carrier 200, a reflow process may be performed to join interconnects 230 to the associated electrical contacts of DCS $600_a$ and DCS $600_b$ with contacts 226 of carrier 200, respectively.

After IC device $302_a$, IC device $302_b$, DCS $600_a$, and DCS $600_b$ are seated to carrier 200, lid 316 may be attached to carrier 200 with adhesive 320 and is attached to IC device $302_a$, IC device $302_b$, DCS $600_a$, and DCS $600_b$ by thermal interface material $312_a$, $312_b$, 312, and $312_d$, respectively. Generally, during data handling operations conducted by IC device $302_a$ and IC device $302_b$, heat is removed from IC device $302_a$ and IC device $302_b$ through e.g., lid 316 and into a cooler system or component (not shown).

Figure 12:
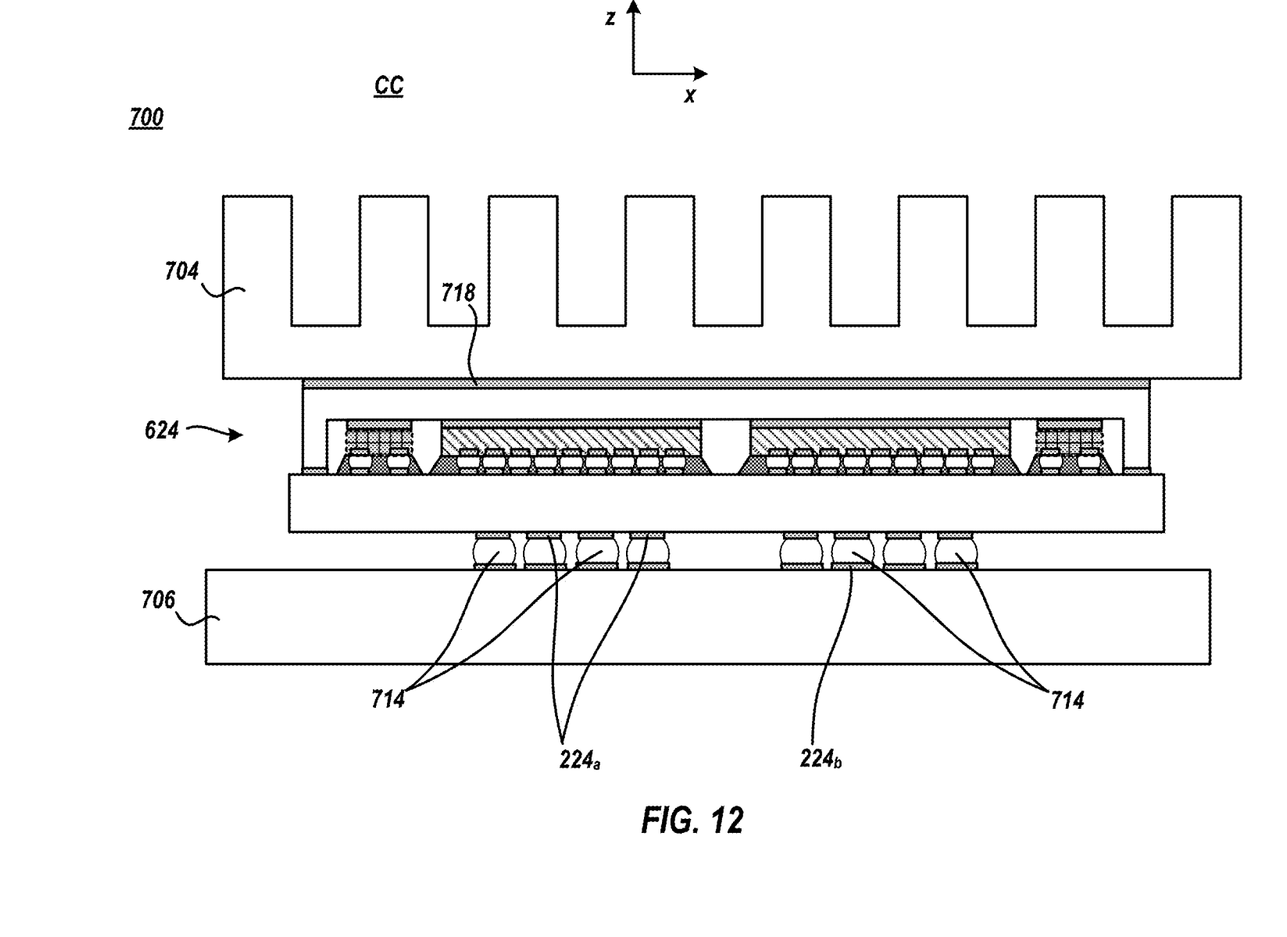
FIG. 12 depicts an electronic system comprising an IC device carrier that utilizes one or more embodiments of the present invention.

FIG. 12 depicts an electronic system 700 comprising an IC device carrier 200 that utilizes a DCS to mitigate resin cracking or propagation there within and to provide decoupling elements to decouple electrical subsystems of the system 700. Electronic system 700 may be for example a computer, server, mobile device, tablet, kiosk, infotainment system, and the like. System 700 may include an IC chip module or package 624, mother board 706, and heat sink 704.

Package 624 may be connected to motherboard 706 via interconnects 714. Motherboard 706 may be the main system board or printed circuit board of electronic device 700, may include electronic components, such as a graphics processing unit, memory, and the like, and provides connectors for other peripherals. Interconnects 714 electrically connect the BSM surface 204 of carrier 200 to motherboard 706 and may be a wire bond, solder bond, stud, conductive ball, conductive button, land grid array (LGA) complaint pins and the like. Interconnects 714 may be larger and thus more robust than interconnects 230, 322. When package 624 is seated upon motherboard 706 a reflow process may be performed to join interconnects 714 to electrical contacts 224 of carrier 200 with respective contacts of motherboard 706. Alternately, a mechanical pressurized interconnect via an intervening socket may be established.

To assist in the removal of heat from the multiple IC devices, a heat sink 304 may be thermally joined to package 624 via thermal interface material 718. Heat sink 704 may be a passive heat exchanger that cools the IC devices by dissipating heat into the surrounding air or may be an active heat exchanger that cools IC devices by dissipating heat into actively cooled circulating fluid. As such, during operation of electronic device 700, a thermal path may exist from IC devices to heat sink 704.

Figure 13:
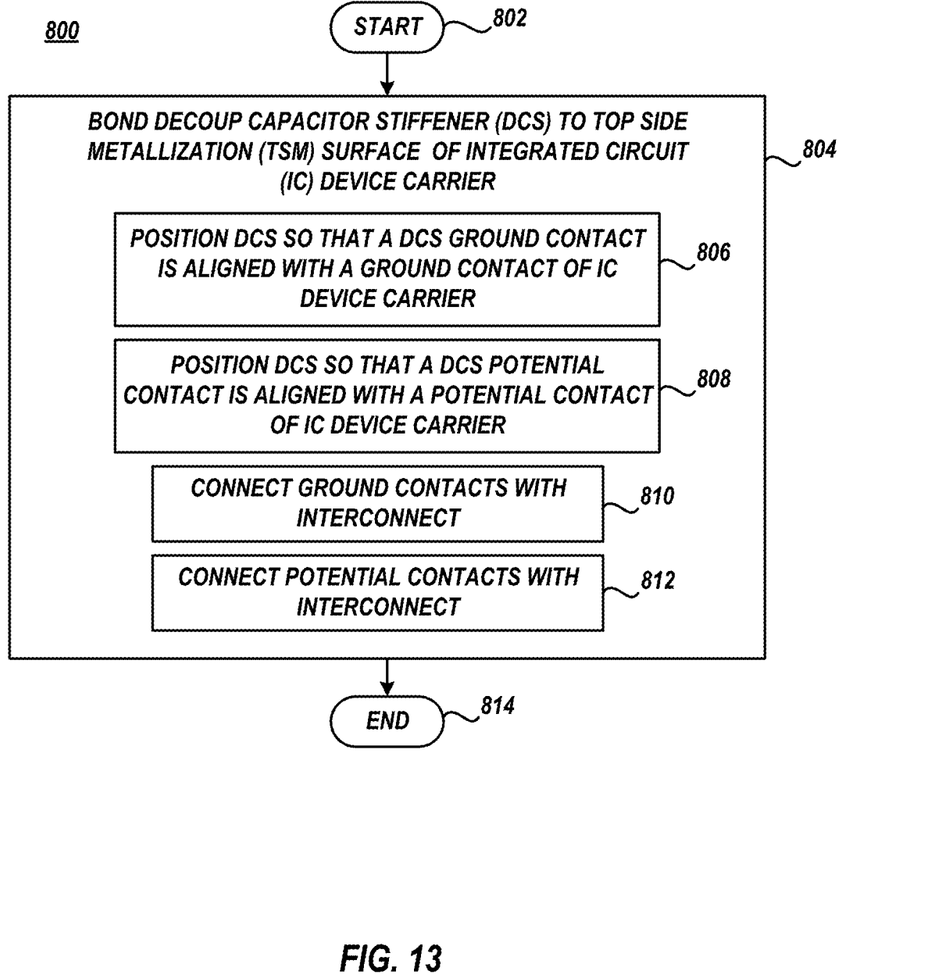
FIG. 13 depicts a method for fabricating an IC device carrier package, according to one or more embodiments of the present invention.

FIG. 13 depicts a method 800 for fabricating an IC device carrier 200 comprising a DCS 600. Method 800 begins at block 802 and continues with applying, forming, bonding, connecting, or otherwise attaching the DCS 600 to the TSM surface 202 of carrier 200 (block 804).

For example, the DCS 600 may be positioned within region 240 so that a contact of the DCS is aligned or in line with ground contact $226_g$ of carrier 200 (block 806). Similarly, the DCS 600 may be positioned within region 240 so that another contact of the DCS is aligned or in line with ground contact $226_v$ of carrier 200 (block 808). In some embodiments, the DCS 600 may be connected to the carrier 200 TSM surface 202 with the adhesive, with underfill, or the like. The adhesive may be subsequently heated to cure (i.e., toughen or harden polymer(s) of adhesive by cross-linking of polymer chains).

DCS 600 provides capacitive elements which may be utilized to decouple a first electrical subsystem or circuit from a second electrical subsystem or circuit of system 700. In other words, DCS 300 shunts noise generated by the first electrical subsystem, reducing the effect the noise has on the rest of the system 700.

DCS 600 may be further connected to carrier 200 by utilizing an interconnect 230 to connect the contact $226_g$ upon the TSM surface 202 of carrier with a contact of the DCS 600 (block 810). DCS 600 may be further connected to carrier 200 by utilizing another interconnect 230 to connect the contact $226_v$ upon the TSM surface 202 of carrier with another contact of the DCS 600 (block 812). DCS 600 adds rigidity or stiffness to carrier 200 to effectively resist local strain forces that would otherwise be exerted upon the carrier 200. The strain forces may be caused by e.g., thermal cycling (i.e. operation of e.g. system 700). As such, the DCS 600 mitigates the risks of cracking and/or crack propagation within carrier 200.

In addition to mitigating the risks of cracking and/or crack propagation within the carrier 200, DCS 600 may also reduce peeling forces that would otherwise cause thermal interface material 312 to peel away from IC device 302.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier 200, regardless of the actual spatial orientation of the carrier 200. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. An integrated circuit (IC) device carrier package comprising:
   an IC device carrier comprising a first contact upon a top side metallization (TSM) surface that is configured to provide ground potential and a second contact upon the TSM surface that is configured to provide non-ground potential;
   a decoupling capacitor stiffener (DCS) comprising a capacitor structure between a first conductive side bar and a second conductive size bar; the capacitor structure comprising a first capacitor plate directly connected to the first conductive side bar, a second capacitor plate directly connected to the second conductive side bar; and insulative material between the first conductive side bar and the second conductive side bar and between the first capacitor plate and the second capacitor plate; the first conductive side bar comprising a first contact pad; and the second conductive side bar comprising a second contact pad;
   a first interconnect that connects the first contact that is configured to provide ground potential with the first contact pad of the first conductive side bar; and
   a second interconnect that connects the second contact that is configured to provide non-ground potential with the second contact pad of the second conductive side bar.

2. The IC device carrier package of claim 1, wherein the insulative material is further between the first conductive side bar and the second capacitor plate and wherein the insulative material is further between the second conductive side bar and the first capacitor plate.

3. The IC device carrier package of claim 1, further comprising:
   an IC device connected to the TSM surface.

4. The IC device carrier package of claim 3, wherein an upper surface of the IC device is coplanar with an upper surface of the capacitor structure.

5. The IC device carrier package of claim 4, wherein the DCS shunts noise generated by the IC device.

6. The IC device carrier package of claim 5, wherein the DCS resists strain forces within the IC device carrier.

7. The IC device carrier package of claim 6, further comprising:
   a lid connected to the TSM surface of the IC device carrier, connected to the upper surface of the IC device, and connected to the upper surface of the capacitor structure.

8. The IC device carrier package of claim 7, wherein the insulative material is further between the second capacitor plate and the lid.

9. An integrated circuit (IC) device carrier package comprising:
   an IC device carrier comprising a first contact upon a top side metallization (TSM) surface that is configured to provide ground potential and a second contact upon the TSM surface that is configured to provide non-ground potential;
   a decoupling capacitor stiffener (DCS) comprising a capacitor structure and a top-side stiffener upon an upper surface of the capacitor structure; the capacitor structure comprising a first capacitor plate connected to a first contact pad upon a lower surface of the capacitor structure by a first vertical interconnect access (VIA); a second capacitor plate connected to a second contact pad upon the lower surface of the capacitor structure by a second VIA; and insulative material between the first capacitor plate and the second capacitor plate;
   a first interconnect that connects the first contact that is configured to provide ground potential with the first contact pad; and
   a second interconnect that connects the second contact that is configured to provide non-ground potential with the second contact pad.

10. The IC device carrier package of claim 9, wherein the insulative material is further between the first capacitor plate and the second VIA.

11. The IC device carrier package of claim 9, further comprising:
    an IC device connected to the TSM surface and wherein an upper surface of the IC device is coplanar with an upper surface of the top-side stiffener.

12. The IC device carrier package of claim 11, wherein the DCS shunts noise generated by the IC device and wherein the DCS resists strain forces within the IC device carrier.

13. The IC device carrier package of claim 12, further comprising:
    a lid connected to the TSM surface of the IC device carrier, connected to the upper surface of the IC device, and connected to the upper surface of the top-side stiffener.

14. The IC device carrier package of claim 13, wherein the insulative material is further between top-side stiffener and the second capacitor plate.

15. An integrated circuit (IC) device carrier package comprising:
    an IC device carrier comprising a first contact upon a top side metallization (TSM) surface that is configured to provide ground potential and a second contact upon the TSM surface that is configured to provide non-ground potential;

a decoupling capacitor stiffener (DCS) comprising a capacitor structure, a first side stiffener upon a first side surface of the capacitor structure, and a second side stiffener upon a second side surface of the capacitor structure; the capacitor structure comprising a first capacitor plate connected to a first contact pad upon a lower surface of the capacitor structure by a first vertical interconnect access (VIA); a second capacitor plate connected to a second contact pad upon the lower surface of the capacitor structure by a second VIA; and insulative material between the first capacitor plate and the second capacitor plate;

a first interconnect that connects the first contact that is configured to provide ground potential with the first contact pad; and a second interconnect that connects the second contact that is configured to provide non-ground potential with the second contact pad.

16. The IC device carrier package of claim 15, wherein the insulative material is further between the first capacitor plate and the second VIA, wherein the insulative material is further between the first side stiffener and the first capacitor plate, and wherein the insulative material is further between the second side stiffener and the second capacitor plate.

17. The IC device carrier package of claim 15, further comprising:

an IC device connected to the TSM surface and wherein an upper surface of the IC device is coplanar with an upper surface of the top-side stiffener, is coplanar with an upper surface of the first side stiffener, and is coplanar with an upper surface of the second side stiffener.

18. The IC device carrier package of claim 17, wherein the DCS shunts noise generated by the IC device and wherein the DCS resists strain forces within the IC device carrier.

* * * * *